United States Patent
Kim et al.

(10) Patent No.: US 7,630,271 B2
(45) Date of Patent: Dec. 8, 2009

(54) SEMICONDUCTOR MEMORY DEVICE INCLUDING A COLUMN DECODER ARRAY

(75) Inventors: Dong Keun Kim, Kyoungki-do (KR); Yong Ki Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 93 days.

(21) Appl. No.: 11/778,368

(22) Filed: Jul. 16, 2007

(65) Prior Publication Data

US 2008/0123461 A1    May 29, 2008

(30) Foreign Application Priority Data

Nov. 29, 2006    (KR) .................. 10-2006-0119340
Nov. 29, 2006    (KR) .................. 10-2006-0119341

(51) Int. Cl.
  *G11C 8/00* (2006.01)
(52) U.S. Cl. .................. 365/230.03; 365/230.08; 365/230.06; 365/189.19; 365/189.14
(58) Field of Classification Search ............ 365/230.03, 365/230.08, 230.06, 189.19, 189.14
  See application file for complete search history.

(56) References Cited

U.S. PATENT DOCUMENTS

| | | | | |
|---|---|---|---|---|
| 2003/0223262 A1* | 12/2003 | Fujisawa | ................... | 365/63 |
| 2004/0004890 A1* | 1/2004 | Fujisawa et al. | ............ | 365/222 |
| 2004/0264260 A1* | 12/2004 | Kono | .................. | 365/189.07 |
| 2005/0259499 A1* | 11/2005 | Kim et al. | ............. | 365/230.03 |
| 2006/0098515 A1* | 5/2006 | Mochida | ................ | 365/230.03 |
| 2007/0162685 A1* | 7/2007 | Suh | .......................... | 711/100 |

FOREIGN PATENT DOCUMENTS

| KR | 1994-0002858 | 2/1994 |
|---|---|---|
| KR | 1020010047329 A | 6/2001 |
| KR | 1020060027665 A | 3/2006 |

\* cited by examiner

*Primary Examiner*—Thong Q Le
(74) *Attorney, Agent, or Firm*—Ladas & Parry LLP

(57) ABSTRACT

A semiconductor memory device is presented that exhibits an enhanced read/write data retrieval efficiency brought about in part by a uniquely shared column array communication scheme. The semiconductor memory device includes: at least one group of banks, the banks being disposed adjacent to each other to form a radially symmetrical arrangement of banks having a row and column geometry; and a column decoder array is positioned between pairs of vertically disposed banks in which the column decoder array communicates with this pair of vertically disposed banks so that a single column select signal from the column decoder array can be used to select a given memory cell of the one bank of this vertically disposed banks.

10 Claims, 5 Drawing Sheets

SEMICONDUCTOR MEMORY DEVICE INCLUDING A COLUMN DECODER ARRAY

CROSS-REFERENCE TO RELATED APPLICATIONS

The present application claims priority to Korean patent application numbers 10-2006-0119340 filed on Nov. 29, 2006 and 10-2006-0119341 filed on Nov. 29, 2006, which is both incorporated herein by reference in their entirety.

BACKGROUND OF THE INVENTION

The present invention relates to a semiconductor memory device, and more particularly to a semiconductor memory device including a column decoder array.

In general, the semiconductor memory device adopts a plurality of banks capable of independent data access. And, a row decoder, a column decoder, a read driver, and a write driver, etc., are provided per each bank so that the cells of the corresponding banks can be accessed and at the same time, the transfer of data between the cells and the input/output pad is formed by means of the driving therebetween.

For example, referring to structures of 4 banks BA_HL, BA_HR, BA_LL and BA_LR of FIG. 1, two banks BA_HL and BA_HR and two banks BA_LL and BA_LR are arranged on both sides of a global input/output line GIO.

And, two row decoder arrays Y-DEC Array for driving each bank BA_HL and BA_HR are arranged between the bank (for example, BA_HL) and the bank (for example, BA_HR).

Also, a column decoder array Y-DEC Array for selecting the corresponding memory cell and a data input/output array DATA I/O Array for reading or writing the data of the selected cell are arranged between the bank (for example, BA_HL) and the global input/output line GIO, and between the bank (for example, BA_LL) and the global input/output line GIO, respectively, as a column select signal transferred from the respective column select signal lines YI_HL and YI_LL.

At this time, the data input/output array DATA I/O Array comprises a write driver WDRV transferring data provided from the global input/output line GIO to a local input/output line (for example, LIO_HL) in a write operation and a read driver ISOA transferring data provided from the local input/output line LIO_HL to the global input/output line GIO in a read operation, wherein the drivers are formed in multiple pairs.

As described above, in the prior art the row decoder array Y-DEC Array, the column decoder array Y-DEC Array, and the data input/output array DATA I/O Array, etc., are arranged per the banks BA_HL, BA_HR, BA_LL, and BA_LR so to control data access.

However, in this case, since a row decoder array X-DEC Array, a column decoder array Y-DEC Array, and a data input/output array DATA I/O Array should be basically arranged, one for each of the banks, it originally has any limitation of efficiently using or minimizing the area.

Also, four data can be output at a time from one bank (for example, BA_HL) with one word line and one column select signal line YI_HL, and in the case of a 8 bit prefetch, 128 data are output from one bank in a x16 structure at the same time so that a total of 32 column decoders are required. In other words, there is a problem that as the number of the data processed at one time increases, the number of the column decoder increases.

In order to reduce the number of the column decoder, as show in FIG. 2, the prior art proposes a structure dividing one bank into two parts BA_U and BA_D and stacking them.

In other words, the semiconductor memory device in the prior art is constituted so that the data of the cells selected by means of one column select signal line YI extended from the column decoder array Y-DEC Array and two word lines WL_U and WL_D extended from the row decoder (not shown) are divided by 4 bits, respectively, to be transferred to the local input/output lines LIO_U and LIO_D, respectfully.

However, in the stack bank structure as shown in FIG. 2, since it takes an extended amount of time when the column select signal provided from the column decoder array Y_DEC Array is transferred to the corresponding cell of the bank BA_U rather than when it is transferred to the corresponding cell of the bank BA_D. Accordingly, there is a limit in reducing the loading of the column select signal and the operation speed.

Also, as the semiconductor memory device becomes a relatively large-capacity device, the capacity required for each bank becomes large, and as the capacity of the bank becomes large, the length of the local input/output line LIO_U coupled to the upper bank BA_U becomes long, causing a problem that the loading may increase.

Further, if the length of the local input/output line LIO_U becomes long, there are problems that arise that are associated with the size of the write driver and the read driver IOSA for driving it becomes large so that current consumption may increase and the area occupied by the data input/output device array DATA I/O Array in the semiconductor memory device may increase.

SUMMARY OF THE INVENTION

The present invention reduces the entire area of a semiconductor memory device by improving a lay-out of a column decoder array coupled to a bank.

The present invention reduces the time that a column select signal is transferred to each bank by symmetrically arranging column decoder arrays in a stack bank structure.

The present invention reduces the length of a local input/output line by symmetrically arranging data input/output device arrays in a stacked bank structure.

The present invention reduces the size of a write driver and a read driver by minimizing the length of a local input/output line.

One embodiment of the present invention provides a semiconductor memory device comprising: at least one group of banks, the banks being adjacent to each other to form a row; and a column decoder array positioned in the center of the one group of banks and simultaneously providing a column select signal for selecting a memory cell of the one group of banks.

Preferably, the one group of banks is subdivided into two subgroups of banks.

Preferably, the column decoder array simultaneously selects the memory cell of the one group of banks.

Preferably, the active sections of the banks adjacent to the column decoder array while forming the group do not overlap.

Preferably, the group of banks forming a 4-bank structure having approximate radial symmetry wherein the 4-bank structure having an upper half and a lower half and the column decoder array arranged between two banks wherein the two banks are not activated at the same time by the column decoder array.

This second embodiment the present invention provides a semiconductor memory device comprising: at least one column decoder array arranged in the approximate center of a bank region; a first and second global input/output lines each arranged on the upper end and the lower end of the bank region; pairs of bank groups adjacently arranged substantially symmetrically along both sides of the column decoder array; data input/output arrays each arranged between the banks and the first and second global input/output lines; and a row decoder arrays each constituted on the banks, wherein the column decoder array is preferably shared by two banks adjacent to the both sides thereof.

Preferably, the column decoder array simultaneously selects the memory cell of the two banks adjacent to the both sides the column decoder array.

Preferably, the active sections of the two banks adjacent to the both sides of the column decoder array do not overlap.

A third embodiment of the present invention provides a semiconductor memory device formed in a stacked structure, the device comprising: a first bank; a column decoder array stacked and arranged to be superposed with the upper part of the first bank; and a second bank stacked and arranged to be superposed with the upper part of the column decoder array, wherein the first and second banks share the column decoder array.

Preferably, the column decoder array simultaneously provides column select signals for selecting the cells corresponding to the first and second banks to the first and second banks by decoding a column address.

According to a fourth embodiment of the present invention provides a semiconductor memory device comprising: a first bank; a first data input/output device array stacked and arranged to be superposed with the upper part of the first bank; a first local input/output line electrically coupling the stacked first bank to the first data input/output device array up and down; a first global input/output line arranged on the upper part of the first data input/output device array and vertically coupled to the first local input/output line; a second bank stacked and arranged to be superposed with the lower of the second bank; a second data input/output device array stacked and arranged to be superposed with the lower of the second bank; a second local input/output line electrically coupling the stacked second bank to the second data input/output device array up and down; a second global input/output line arranged on the lower of the second data input/output device array and vertically coupled to the second local input/output line; and a column decoder array arranged to be superposed between the first bank and the second bank and shared by the first bank and the second bank.

In the constitution, preferably, the first local input/output line and the second local input/output line are formed at about the same length to be symmetrical with each other.

In the constitution, preferably, the first and second data input/output device arrays each includes a plurality of read drivers amplifying read data in a read operation and a plurality of write drivers amplifying write data in a write operation.

In the constitution, preferably, the column decoder array simultaneously provides column select signals for selecting the cells corresponding to the first and second banks to the first and second banks by decoding a column address.

A fifth embodiment of the present invention provides a semiconductor memory device having a stack structure where a plurality of banks are stacked to be superposed with each other, the device comprising: a plurality of column decoder arrays arranged on a pair of banks up and down arranged to be superposed with the banks, wherein the respective column decoder arrays are formed to be up and down coupled to the pair of banks so that the column select signal decoding a column address in the respective column decoder array is shared by the pair of banks.

DESCRIPTION OF SPECIFIC EMBODIMENTS

Hereinafter, preferred embodiments of the present invention will be described in detail with reference to the accompanying drawings.

The semiconductor memory device according to the present invention is made of adjacent pairs of banks, which are not activated at the same time, and which share one column decoder array, wherein the two banks are arranged substantially symmetrically along both sides of the shared column decoder array or are arranged to be superposed therewith up and down relative to the shared column decoder array. The shared column decoder array provides a column select signal to the adjacent aligned pair of banks.

Figure 1:
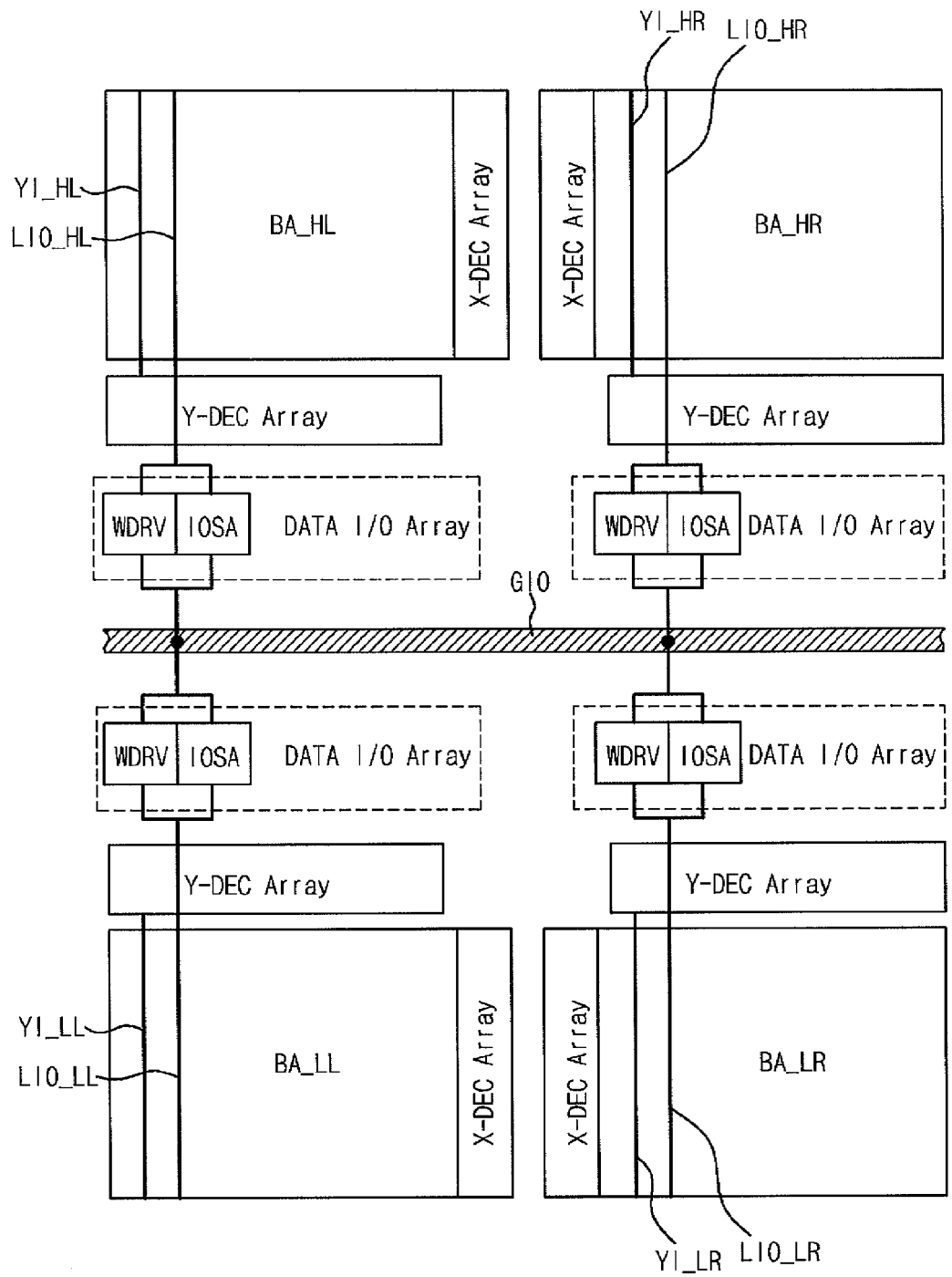
FIG. 1 depicts a lay-out view of a semiconductor memory device in a 4 bank structure according to a prior art.
Figure 2:
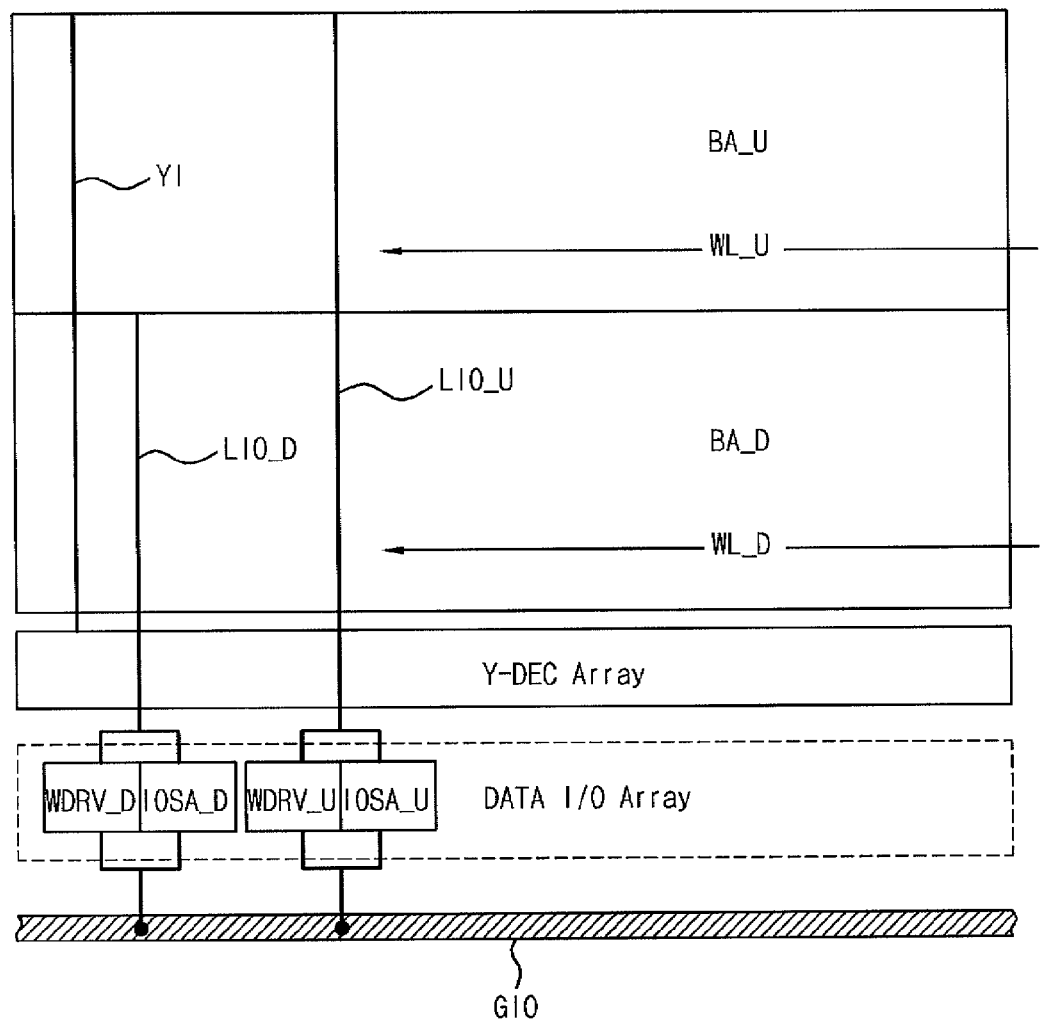
FIG. 2 depicts a lay-out view showing an embodiment of a semiconductor memory device in a 4-bank structure according to the present invention.
Figure 3:
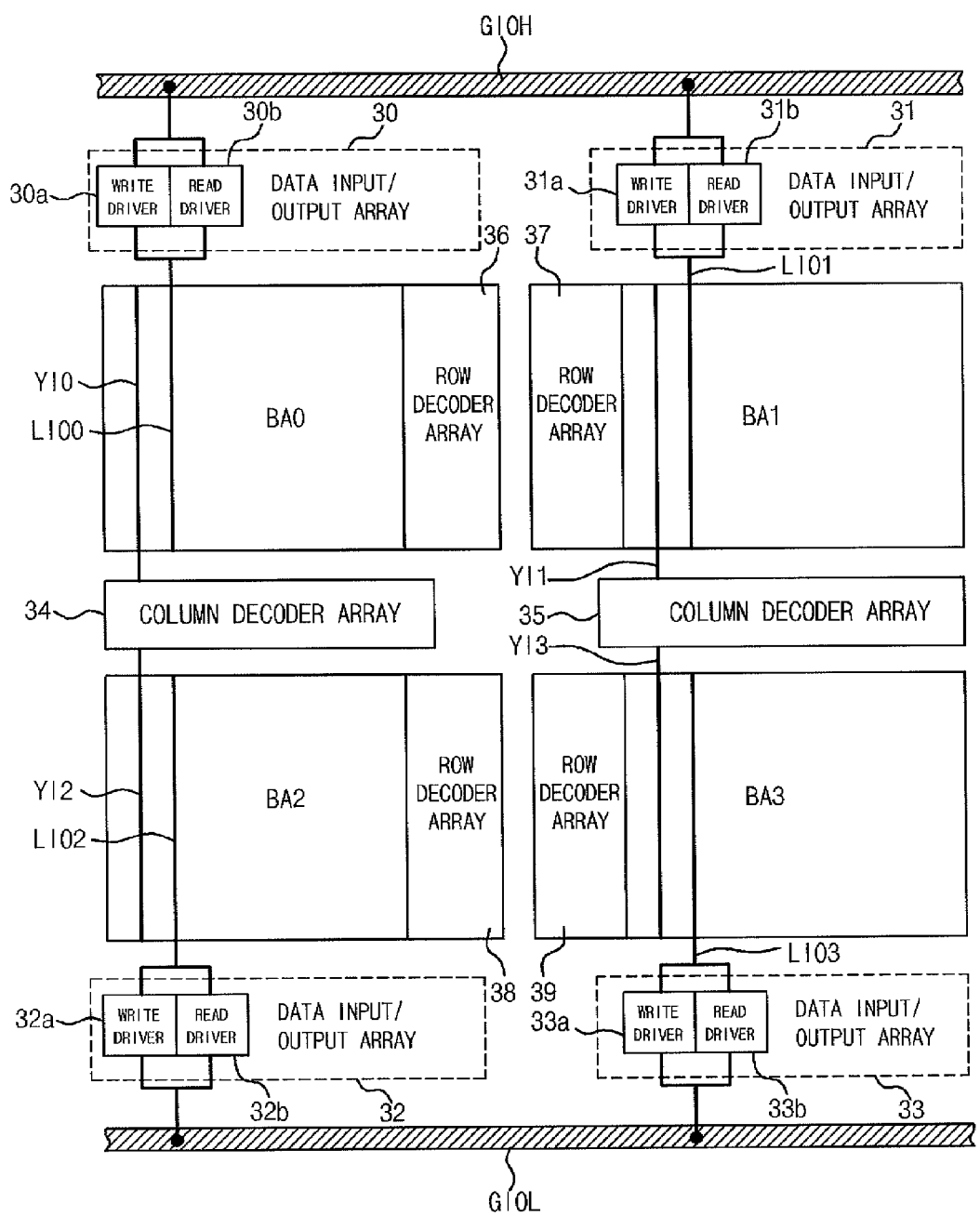
FIG. 3 depicts a lay-out view of a semiconductor memory device in accordance to the present invention.

Specifically, as one embodiment, as shown in FIG. 3, the semiconductor memory device according to the present invention comprises four banks BA0, BA1, BA2, and BA3, four data input/output arrays 30 to 33, two column decoder arrays 34 and 35, four row decoder arrays 36 to 39, and two global input/output lines GIOH and GIOL in a bank region.

Among others, the two column decoder arrays 34 and 35 are arranged in the center of the bank region where they are physically separate from each other, and the two global input/output lines GIOH and GIOL each are positioned on the upper end and the lower end of the bank region.

And, the bank BA0 and the data input/output array 30 are arranged between the column decoder array 34 and the global input/output line GIOH, wherein the bank BA0 is adjacently arranged next to the column decoder array 34 and the data input/output array 30 is adjacently arranged next to the global input/output line GIOH.

Also, the bank BA1 and the data input/output array 31 are arranged between the column decoder array 35 and the global input/output line GIOH, wherein the bank BA1 is adjacently arranged next to the column decoder array 35 and the data input/output array 31 is adjacently arranged next to the global input/output line GIOH.

Also, the bank BA2 and the data input/output array 32 are arranged between the column decoder array 34 and the global input/output line GIOL, wherein the bank BA2 is adjacently arranged next to the column decoder array 34 and the data input/output array 32 is adjacently arranged next to the global input/output line GIOL.

Further, the bank BA3 and the data input/output array 33 are arranged between the column decoder array 35 and the global input/output line GIOL, wherein the bank BA3 is adjacently arranged next to the column decoder array 35 and the data input/output array 33 is adjacently arranged next to the global input/output line GIOL.

Each of the row decoder arrays 36 and 37 are adjacently arranged along the side where the banks BA0 and BA1 arranged on the upper of the column decoder array 34 and 35 are faced with each other, and the each row decoder arrays 38 and 39 are adjacently arranged along the side where the banks BA2 and BA3 arranged on the lower of the column decoder array 34 and 35 are faced with each other.

Herein, the respective data input/output arrays 30 to 33 comprises a plurality of write drivers 30a to 33a and a plurality of read drivers 30b to 33b.

Among the banks BA0, BA1, BA2, and BA3, the adjacent banks BA0 and BA2 bisected with the column decoder array 34 therebetween are not anticipated to be activated at the same time, and likewise the adjacent banks BA1 and BA3 bisected with the column decoder array 35 therebetween are also not anticipated to be activated at the same time, either.

And, the local input/output lines LIO0, LIO1, LIO2, and LIO3 of the respective banks BA0, BA1, BA2, and BA3 are coupled in common to the write drivers 30a to 33a and to the read drivers 30b to 33b included in the adjacent data input/output arrays 30 to 33.

Also, the column decoder array 34 provides the same column select signal to the column select signal line YI0 and to the column select signal line YI2, wherein the column select signal YI0 is extended to the BA0 and the column select signal line YI2 is extended to the bank BA2.

Further, the column decoder array 35 provides the same column select signal to the column select signal line YI1 and to the column select signal line YI3, wherein the column select signal YI1 is extended to the BA1 and the column select signal line YI3 is extended to the bank BA3.

The one embodiment of the present invention having such an arrangement controls one column decoder array 34 arranged between the two banks (for example, BA0 and BA2) faced with each other to simultaneously select the memory cells of the respective banks BA0 and BA2.

For one example, if the bank BA0 performs a read operation when the bank BA0 is activated, the data of the corresponding memory cell is selected by the row decoder array 36 and the column decoder array 34, and the selected data is transferred to the data input/output device array 30 through the local input/output line LIO0.

At this time, the row decoder array 36 drives the corresponding memory cell by decoding a row address, and the column decoder array 34 provides the column select signal for simultaneously selecting the corresponding memory cells of the two banks BA0 and BA2 to the respective banks BA0 and BA2 by decoding a column address.

However, since the two banks faced with each other are not simultaneously activated, the data transferred from the memory cell selected in the bank BA2 to the local input/output line LIO2 does not exist.

In other words, although the corresponding memory cells of the two banks BA0 and BA2 are simultaneously selected by the column decoder array 34, the two banks BA0 and BA2 are not simultaneously activated. Therefore, the data of the memory cell selected in any one (for example, BA2) of the two banks BA0 and BA2 are not transferred to the local input/output line LIO2.

The data transferred to the input/output array 30 through the local input/output line LIO0 are amplified by the read driver 30b and then is output to the external component through the global input/output line GIO_H.

Meanwhile, if the bank BA0 is activated to perform a write operation, the data input from the external component is transferred to the data input/output device array 30 through the global input/output line GIO_H.

The data transferred to the data input/output device array 30 is amplified by the write driver 30a and then is transferred to the bank BA0 through the local input/output line LIO0.

Thereafter, the data transferred to the bank BA0 are stored in the memory cell selected by the row decoder array 36 and the column decoder array 34.

At this time, since the bank BA2 is in a non-activated state, although the corresponding memory cells of the two banks BA0 and BA2 are selected by the column decoder array 34, the data are not written in the bank BA2 and only written in bank BA0.

The read or write operation of the rest two banks BA1 and BA 3 is performed in substantially the same manner as that of the two banks BA0 and BA2 and thus the detailed explanation thereof will be omitted.

As described above, the one embodiment of the semiconductor memory device according to the present invention simultaneously controls the two banks (for example, BA0 and BA2), which are simultaneously activated, by one column decoder array (for example, 34).

Therefore, since the one embodiment of the present invention can array one column decoder array 34 per two banks (for example, BA0 and BA2), it can reduce the number of the column decoder, thereby having an effect that the remained space in the bank peripheral region can increase as compared to the prior art.

As shown in FIG. 3, one embodiment of the present invention comprises that the column decoder array is arranged into the four bank structure, but the present invention is not limited thereto and can reduce the area of the bank peripheral region by properly arranging the column decoder array as described above in an n bank structure (herein, n is a natural even integer number which is 2 or more).

At this time, when n banks are formed of even numbers, they are grouped by two banks not simultaneously activated and one column decoder array is arranged between the two grouped banks so that the two banks may be arranged to share one column decoder array.

Also, 'i' banks (herein, $2 \leqq 'i' \leqq n$, where 'i' is a natural number) not simultaneously activated in the n banks may be arranged to share one column decoder array.

Figure 4:
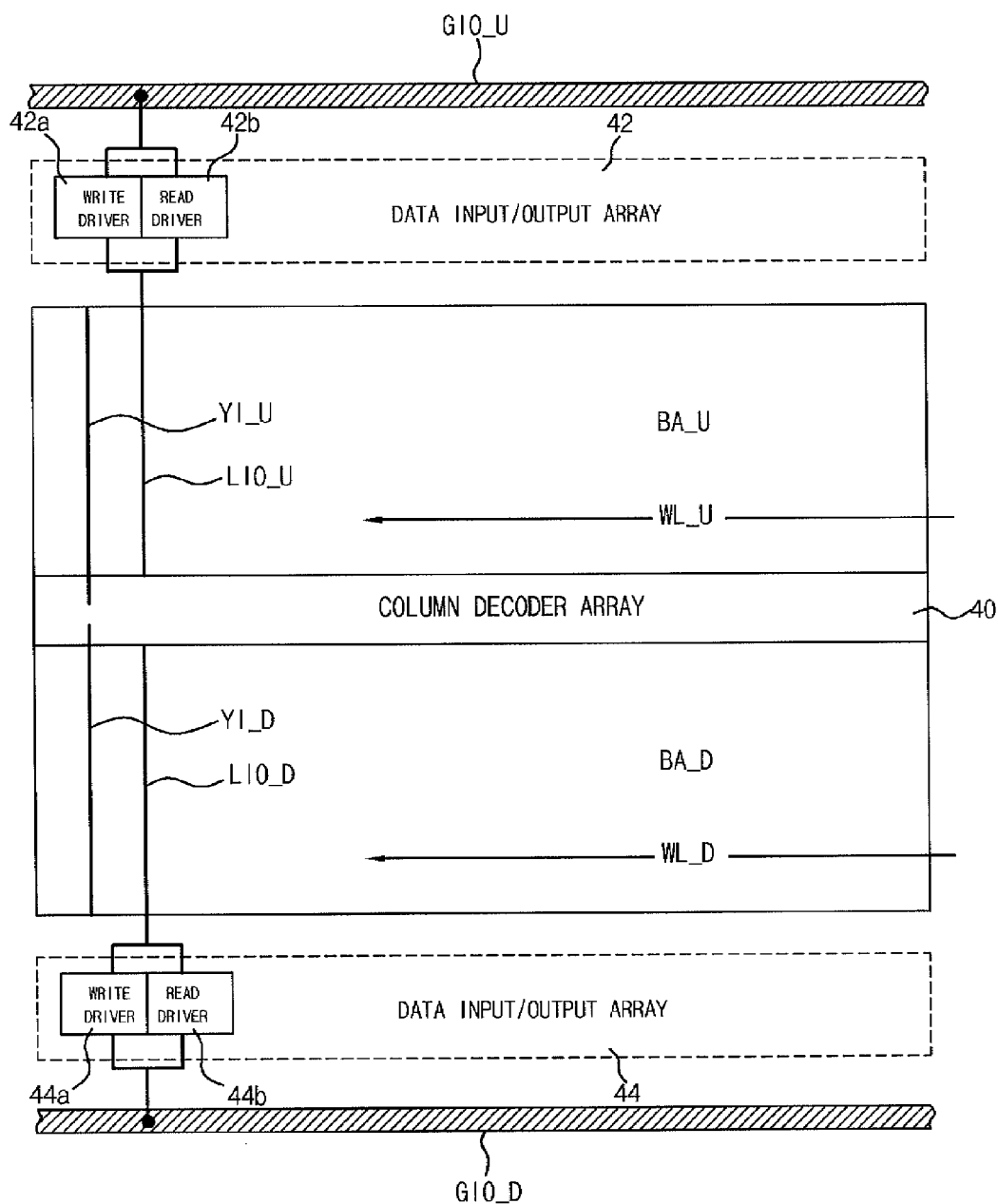
FIG. 4 depicts lay-out view of another embodiment of the semiconductor memory device in accordance to the present invention.

As depicted in FIG. 4, as an another embodiment, the semiconductor memory device according to the present invention comprises two banks BA_U and BA_D, one column decoder array 40, two data input/output arrays 42 and 44, and two global input/output lines GIO_U and GIO_D in a bank region.

Among others, one column decoder array 40 is arranged between the two banks BA_U and BA_D, and the two global input/output lines GIO_U and GIO_D each are arranged on the upper and the lower of the bank region.

At this time, the column decoder array 40 generates a column select signal for simultaneously selecting the cells corresponding to the two banks BA_U and BA_D by decoding a column address, and preferably, the column decoder array 40 is arranged between the two banks BA_U and BA_D so that a time that the column select signal is transferred to the cells corresponding to the respective banks BA_U and BA_D.

The bank BA_U and the data input/output array 42 are stacked and arranged to be superposed with each other between the column decoder array 40 and the global input/output line GIO_U, wherein the bank BA_U is stacked and arranged to be superposed with the upper of the column decoder array 40, and the data input/output array 42 is arranged on the lower of the global input/output line GIO_U.

Also, the bank BA_D and the data input/output array 44 are stacked and arranged to be superposed with each other between the column decoder array 40 and the global input/output line GIO_D, wherein the bank BA_D is stacked and arranged to be superposed with the lower of the column decoder array 40, and the data input/output array 44 is arranged on the upper of the global input/output line GIO_D.

Herein, the data input/output arrays 42 and 44 each comprises a plurality of write drivers 42*a* and 44*a* and a plurality of read drivers 42*b* and 44*b*.

And, the local input/output lines LIO_U and LIO_D of the respective banks BA_U and BA_D are coupled in common to the plurality of write drivers 42*a* and 44*a* and the plurality of read drivers 42*b* and 44*b* included in the neighboring data input/output arrays 42 and 44.

Also, the respective global input/output lines GIO_U and GIO_D are vertically coupled to the local input/output lines LIO_U and LIO_D of the respective banks GIO_U and GIO_D coupled in common to the plurality of write drivers 42*a* and 44*a* and the plurality of read drivers 42*b* and 44*b*.

Further, the column decoder array 40 provides the same column select signal to the column select signal line YI_U and the column select signal line YI_D, wherein the column select signal YI_U is extended to the BA_U and the column select signal line YI_D is extended to the bank BA_D.

Another embodiment of the present invention having such an arrangement simultaneously selects the cells corresponding to the two banks BA_U and BA_D by means of the column select signal provided from the column decoder array 40.

And, the data of the cell selected in the bank BA_U are amplified to be written or read through the plurality of write drivers 42*a* and the plurality of read drivers 42*b* provided in the data input/output device array 42.

Also, the data of the cell selected in the bank BA_U are amplified to be written or read through the plurality of write drivers 44*a* and the plurality of read drivers 44*b* provided in the data input/output device array 44.

Figure 5:
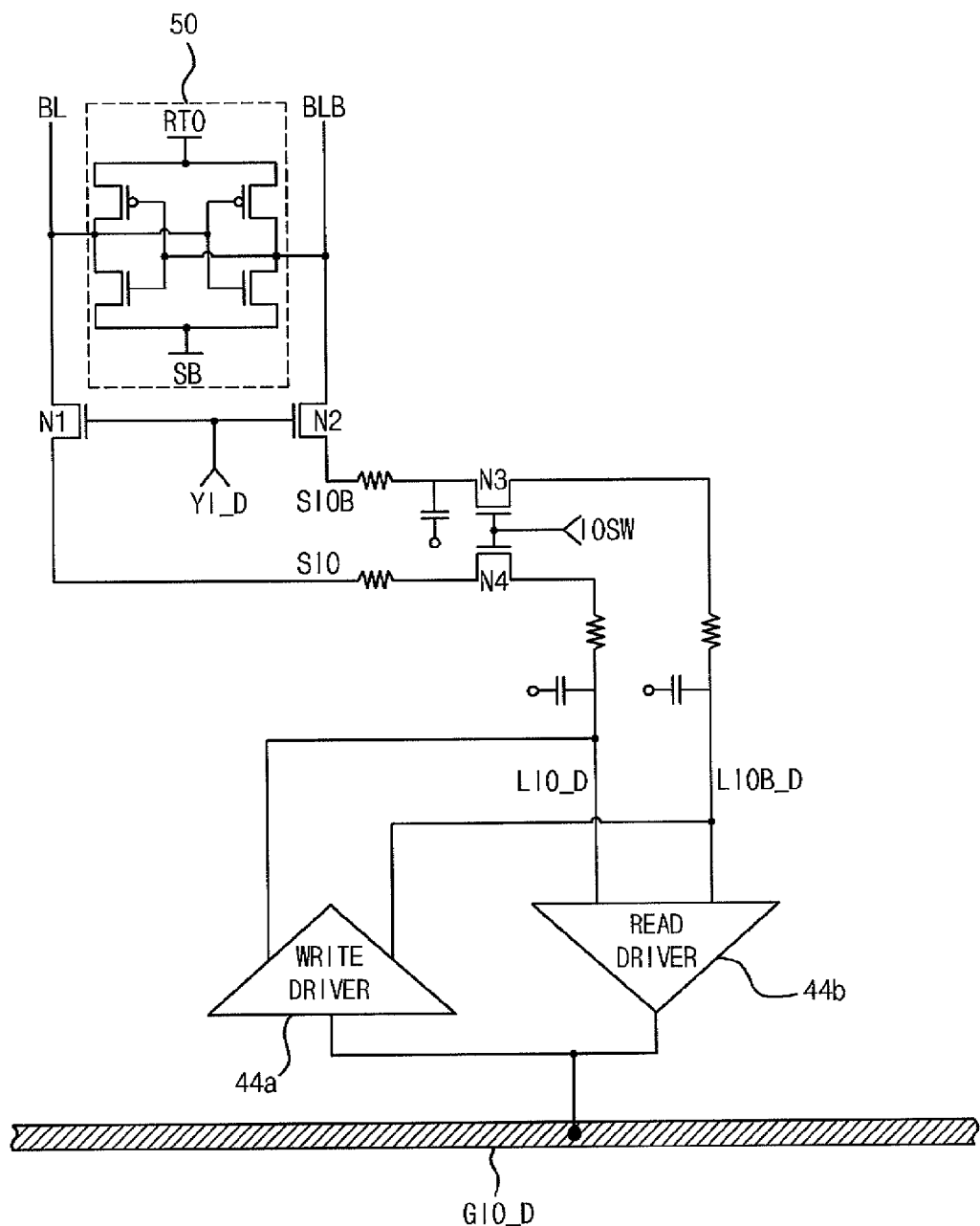
FIG. 5 depicts an electronic scheme for a read/write operation of one embodiment of the present invention.

As one example, the read operation of another embodiment of the present invention will be described in detail with reference to FIGS. 4 and 5. A row decoder array (not shown) decodes a row address to activate two word lines WL_U and WL_D for driving the corresponding cells of the two banks BA_U and BA_D.

A specific cell of a bank BA_D is driven by an activated word lines WL_D and the data stored in the driven cell is transferred to any one of a bit line pair BL and BLB.

This generates minute potential difference in the bit line pair BL and BLB. A bit line sensing amplifier 50 is operated by the driving signals RTO and SB to sense and to amplify the potential difference in the bit line pair BL and BLB.

During this operation, a column decoder array 40 decodes a column address to generate a column select signal YI_D for selecting the corresponding cells of the two banks BA_U and BA_D at the same time.

Accordingly, NMOS transistors N1 and N2 are turned-on by the column select signal YI_D to couple the bit line pair BL and BLB to a segment input/output line pair SIO and SIOB so that the amplified signals of the bit line pair BL and BLB are transferred to the segment input/output line pair SIO and SIOB.

The NMOS transistors N3 and N4 are turned-on by an input/output line switching signal IOSW to couple the segment input/output line pairs SIO and SIOB to a local input/output line pair LIO_D and LIOB_D so that the signals of the segment input/output line pair SIO and SIOB are transferred to the local input/output line pair LIO_D, LIOB_D.

Thereafter, a read driver 44*b* provided in the data input/output device array 44 senses and amplifies the potential difference of the signals transferred to the local input/output line pair LIO_D and LIOB_U to transfer the corresponding data to a global input/output line GIO_D.

Likewise, a specific cell of a lower bank BA_U is driven by the activated word line WL_U and the data stored in the driven cell is transferred to the local input/output line pair LIO_U and LIOB_U (not shown) through the same process as the bank BA_D.

Thereafter, a read driver 42*b* provided in the data input/output device array 42 senses and amplifies the potential difference of the signals transferred to the local input/output line pair LIO_U and LIOB_U (not shown) to transfer the corresponding data to a global input/output line GIO_D.

In the embodiment of the present invention, n bits of data is output from the bank BA_U the word line WL_U and the column select signal YI and n bits of data is output from the bank BA_D by means of the word line WL_D and the column select signal YI.

That is, 2n bits of data can be read and written at a time as the two word lines WL_U and WL_D and one column select signal YI.

At this time, the column decoder array 40 is arranged between the two banks BA_U and BA_D so that the time that the column select signal YI is transferred to the respective banks BA_U and BA_D can be minimized.

Therefore, another embodiment of the present invention has an effect that the time selecting the corresponding cells of the banks BA_U and BA_D reduces by the column select signal YI, making it possible to reduce the loading of the column select signal YI and at the same time, to improve memory operation speed.

Also, another embodiment of the present invention arranges the upper data input/output device array 22 for driving the data input/output of the bank BA_U to be adjacent the upper of the bank BA_U and arranges the data input/output device array 44 for driving the data input/output of the bank BA_D to be adjacent the lower of the bank BA_D.

Accordingly, another embodiment of the present embodiment has an effect that it can reduce the length of the respective local input/output lines LIO_U and LIO_D the loading of the respective local input/output lines LIO_U and LIO_D reduces, making it possible to reduce data error.

Further, another embodiment of the present invention properly arranges the respective data input/output device arrays 42 and 44 to minimize the length of the respective local input/output lines LIO_U and LIO_D so that the sizes of a plurality of write drivers 42*a* and 44*a* and a plurality of read drivers 42*b* and 44*b* provided in the respective data input/output device arrays 42 and 44 can be reduced.

Accordingly, it has an effect that the current consumption of the respective data input/output device arrays 42 and 44 can be reduced and the area occupied by the respective data input/output device arrays 42 and 44 in the semiconductor memory device can also be reduced.

As described above, the present invention has an effect that it arranges the banks, which are not activated at the same time, to share one column decoder array so that the entire area of the semiconductor memory device can reduce.

And, the present invention has an effect that it forms a stack structure by arranging the column decoder array between two stacked banks so that the loading of the column select signal can reduce and the data processing speed can increase.

Also, the present invention has an effect that it divides the data input/output device array into two and arranges them on the upper and lower of the respective banks in a stack structure so that the loading the local input/output line can reduce.

Further, the present invention has an effect that it divides and arranges the data input/output device arrays in the respective banks so that the length of the local input/output line is minimized, making it possible to reduce the sizes of the write driver and the read driver.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device comprising:
  a first and a second banks forming a bank region;
  a column decoder array configured to be arranged in a center of the bank region between the first and second banks and provide column select signals to the first and second banks;
  a first data input and output array configured to be arranged in an upper end of the banks region, read data of a first local input/output lines and write data to the first local input/output lines, wherein the first local input/output lines are electrically coupled with the first bank; and
  a second data input and output array configured to be arranged in a lower end of the bank region, read data of a second local input/output lines and write data to the second local input/output lines, wherein the second local input/output lines are electrically coupled with the second banks.

2. The semiconductor memory device as set forth in claim 1, wherein the column decoder array simultaneously selects the memory cell of the first and second banks.

3. The semiconductor memory device as set forth in claim 1, wherein active operation section of the first and second banks adjacent to the column decoder array do not overlap each other.

4. The semiconductor memory device as set forth in claim 1, wherein the first and second banks are not activated at the same time.

5. A semiconductor memory device comprising:
  a column decoder array arranged in the center of a bank region;
  a first and second global input/output lines each arranged on an upper and lower end of the bank region;
  a plurality of banks adjacently arranged in pairs of banks along both sides of the column decoder array;
  data input/output arrays arranged between the plurality of banks and between the first and second global input/output lines; and
  a plurality of row decoder arrays each row decoder array connected to the plurality of banks, wherein the column decoder array is connected to two adjacent banks abjacent to the both sides of the column decoder array thereof and simultaneously selects the memory cell of the two banks abjacent to the both sides of the column decoder array thereof.

6. the semiconductor memory device as set forth in claim 5, wherein the active operation sections of the two banks adjacent to the both sides of the column decoder array are not overlapped.

7. A semiconductor memory device comprising:
  a first bank;
  a first data input/output device array stacked and arranged to be overlapped with an upper portion of the first bank;
  a first local input/output line electrically connecting the stacked first bank to the first data input/output device array wherein the first local input/input line arranged up and down relative to the first bank;
  a first global input/output line arranged on the upper of the first data input/output device array and electrically connected to the first local input/output line, the first global input/output line arranged horizontally relative to the first bank;
  a second bank stacked and arranged below a lower portion of the first bank;
  a second data input/output device array stacked and arranged to be overlapped with a lower portion of the second bank;
  a second local input/output line electrically connecting the stacked second bank to the second data input/output device array, the second local input/output line arranged up and down relative to the second bank;
  a second global input/output line arranged on the lower of the second data input/output device array and electrically connected to the second local input/output line, the second global input/output line arranged horizontally relative to the second bank; and
  a column decoder array arranged to be overlapped between the first bank and the second bank and electrically connected to both the first bank and the second bank.

8. The semiconductor memory device as set forth in claim 7 wherein the first local input/output line and the second local input/output line are formed at about the same length to be approximately symmetrical with respect to each other.

9. The semiconductor memory device as set forth in claim 7 wherein the first and second data input/output device array each includes a plurality of read drivers amplifying read data in a read operation and a plurality of write drivers amplifying write data in a write operation.

10. The semiconductor memory device as set forth in claim 7 wherein the column decoder array simultaneously provides column select signals selecting cells within the first and second banks by decoding a column address.

* * * * *